(12) United States Patent
Krygowski et al.

(10) Patent No.: US 9,218,442 B2
(45) Date of Patent: Dec. 22, 2015

(54) FIRMWARE AND HARDWARE VERIFICATION USING OPCODE COMPARISON

(75) Inventors: Christopher A. Krygowski, Lagrangeville, NY (US); Michael P. Mullen, Poughkeepsie, NY (US); Timothy J. Slegel, Staatsburg, NY (US); Kai Weber, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 1313 days.

(21) Appl. No.: 12/822,417

(22) Filed: Jun. 24, 2010

(65) Prior Publication Data

US 2011/0320783 A1    Dec. 29, 2011

(51) Int. Cl.
*G06F 9/30* (2006.01)
*G06F 17/50* (2006.01)
*G06F 11/36* (2006.01)

(52) U.S. Cl.
CPC .............. *G06F 17/504* (2013.01); *G06F 9/30* (2013.01); *G06F 11/3636* (2013.01); *G06F 11/3648* (2013.01)

(58) Field of Classification Search
None
See application file for complete search history.

(56) References Cited

U.S. PATENT DOCUMENTS

| | | | |
|---|---|---|---|
| 5,796,972 A * | 8/1998 | Johnson et al. | 712/208 |
| 5,983,337 A * | 11/1999 | Mahalingaiah et al. | 712/32 |
| 2004/0210720 A1* | 10/2004 | Wong et al. | 711/132 |
| 2007/0214398 A1* | 9/2007 | Zhang et al. | 714/728 |
| 2009/0031121 A1* | 1/2009 | Henry et al. | 712/226 |
| 2009/0210659 A1* | 8/2009 | Carlough et al. | 712/205 |
| 2011/0047428 A1* | 2/2011 | Kikta et al. | 714/733 |

* cited by examiner

*Primary Examiner* — Jacob A Petranek
(74) *Attorney, Agent, or Firm* — Cantor Colburn LLP; Margaret McNamara

(57) ABSTRACT

A verification method is provided and includes randomly choosing a hardware executed instruction in a predefined program to force Opcode Compare on, determining an identity of a corresponding opcode from the chosen instruction and initializing Opcode Compare logic to trap the chosen instruction to firmware and creating firmware to initiate performance of hardware verification in the firmware and re-initiating performance of the hardware verification in hardware.

20 Claims, 6 Drawing Sheets

FIG. 4

1. LIC Instruction to wait for Translator to not be busy
2. LIC Instruction to turn on control to Purge TLB
3. LIC Instruction to wait for Purge TLB complete
4. LIC Instruction to clear the compare_reg
6. LIC Instruction to read old Instruction Address
7. LIC Instruction to update new Instruction Address
8. LIC Instruction to leave LIC mode

FIRMWARE AND HARDWARE VERIFICATION USING OPCODE COMPARISON

BACKGROUND

This invention relates generally to processing within a computing environment and, more particularly, a method of hardware verification using opcode compare operations in conjunction with dynamically created licensed internal code (LIC).

In the context of hardware and software systems of, for example, computing environments, formal verification is the act of proving or disproving the correctness of intended algorithms underlying a system with respect to a certain formal specification or property. Formal verification can be helpful in proving the correctness of systems, such as cryptographic protocols, combinational circuits, digital circuits with internal memory and software expressed as source code. Verification is one aspect of testing a product's fitness for a particular purpose. Validation is the complementary aspect. Often, one refers to the overall checking process as V & V where validation attempts to answer the question of whether a product specified to a user's actual needs and verification attempts to answer the question of whether the product actually conforms to the specifications.

BRIEF SUMMARY

In accordance with an aspect of the invention, a computer program product for a verification operation is provided and includes a tangible storage medium readable by a processing circuit and storing instructions for execution by the processing circuit for performing a method including randomly choosing a hardware executed instruction in a predefined program to force Opcode Compare on, determining an identity of a corresponding opcode from the chosen instruction and initializing Opcode Compare logic to trap the chosen instruction to firmware and creating firmware to initiate performance of hardware verification in the firmware and re-initiating performance of the hardware verification in hardware.

In accordance with another aspect of the invention, an apparatus for performing verification is provided and includes a microprocessor in communication with a memory unit configured to perform a method including randomly choosing a hardware executed instruction in a predefined program to force Opcode Compare on, determining an identity of a corresponding opcode from the chosen instruction and initializing Opcode Compare logic to trap the chosen instruction to firmware and creating firmware to initiate performance of hardware verification in the firmware and re-initiating performance of the hardware verification in hardware.

In accordance with yet another aspect of the invention, a computer implemented method of verification is provided and includes building/loading firmware and an opcode compare register, loading initial values for registers and memory into a simulation model and beginning an instruction stream test case to trap an opcode compare to the firmware, to execute a TLB purge, to clear to opcode compare register, to point a PGM IA to an add instruction and to exit firmware, re-executing the add instruction by hardware and executing a subtract instruction to complete the instruction stream test case and comparing final register and memory results against expected values. Note: the TLB purge is an example of one of many special hardware functions that we verify using this technique.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES in which:

FIG. 4 is a set of sample LIC instructions created by the programming of FIG. 3;

DETAILED DESCRIPTION

Verification of specialized hardware may include a 'Purge TLB' function, which is logic that exists for use by firmware or microcode used by a processor for assisting executing architected instructions or implementing architected features, such as licensed internal code (LIC), to work around a potential design bug found late in the development cycle. Hereinafter, the terms licensed internal code or LIC will be used for descriptive purposes but it is to be understood that these are merely exemplary and that other terminology, such as "firmware", "microcode" or other similar terms, could be used instead. Additionally, for at least certain types of processors, there exists opcode compare logic, which allows the processor to 'trap' on an instruction opcode and force that instruction to be executed by LIC.

An opcode compare function can be used in verification procedures in conjunction with dynamically created LIC to verify hardware logic. Previous solutions involved writing run time executive (RTX) simulation programs that were often complex. In accordance with aspects of the invention and, in a simulation environment, RTX programs are now developed and executed to allow for control of a hardware model under test to be used for initializing the model, creating stimulus for the model, detecting error states and other similar operations. Additionally, instruction sequence tests, called architectural verification programs (AVPs), may be run on the model under test.

In accordance with further aspects of the invention, a particular RTX program randomly picks one or more instructions from the AVP and initializes Opcode Compare logic with instruction opcodes to force those opcodes to operate according to licensed internal code (LIC). The RTX program also dynamically builds LIC instructions to exercise a particular function in the hardware logic such as, for example, the 'Purge TLB' operation.

When the model under test executes the chosen opcode, the Opcode Compare logic will trap to the LIC and the LIC will execute instructions which will verify the specialized hardware logic. There are several advantages of this. One advantage is that ease of verifying specialized logic will be encouraged. By using LIC, relatively powerful capabilities to exercise all sorts of controls are provided in a relatively easy manner. Also, the logic that is being verified is typically used by LIC anyway. Another advantage is to permit seamless integration into the simulation environment. With the methods of the present invention incorporated into AVP methodology, instruction sequence tests already in existence will be completed successfully assuming there is no design bug in the specialized logic being tested. A still further advantage is the randomness of when the specialized verification occurs. Since a random instruction is chosen for the trap to LIC, the LIC will run at a random point in time during the simulation. Randomness is an important aspect of any verification method.

Figure 1:
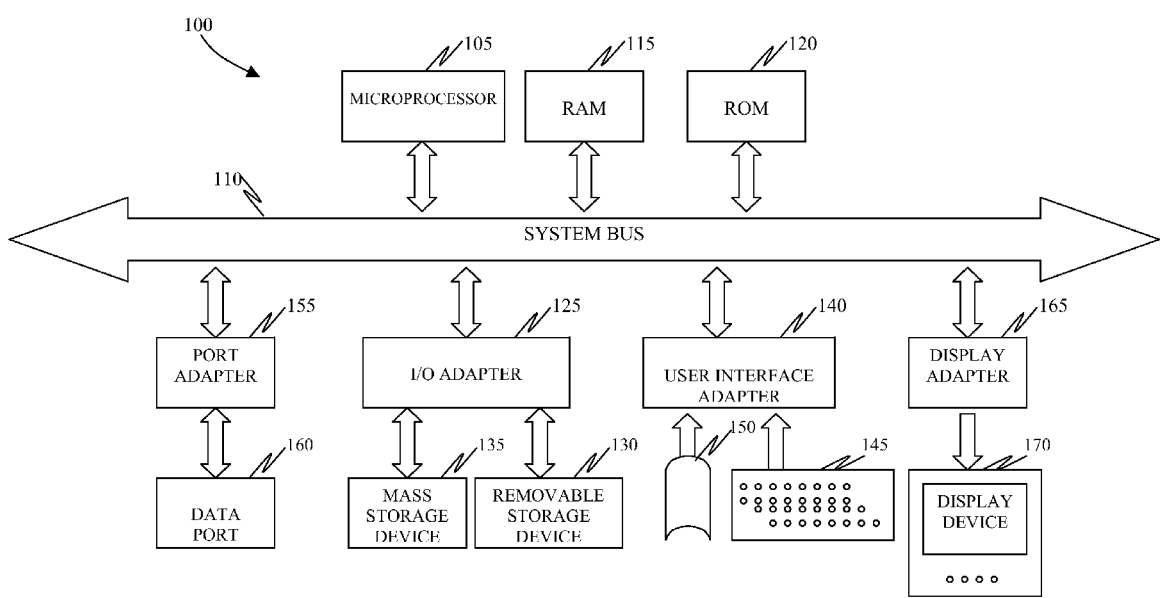
FIG. 1 is a schematic illustration of an exemplary computing device.

With reference to FIG. 1, an exemplary computing device 100 is provided by which the methods of the present invention may be conducted. The computing device 100 includes a central processing unit (CPU), such as a microprocessor 105, and memory or storage units, such as random access memory (RAM) 115 and read-only memory (ROM) 120). The CPU and the memory or storage units are coupled to and disposed in signal communication with one another via a system bus 110. Also coupled to and disposed in signal communication with the system bus 110 may be an I/O adapter 125, a user interface adapter 140, a port adapter 155 and a display adapter 165. The I/O adapter 125 may be coupled to a removable storage device 130 and a mass storage device 135. The user interface adapter 140 may receive input from a keyboard 145 and/or a mouse 150. The port adapter 155 may be coupled to a data port 160 and the display adapter 165 may be coupled to a display device 170.

The memory or storage units may include a non-transitory computer readable medium having executable instructions stored thereon. When executed, these executable instructions may be configured to cause the CPU to operate in the manner described below with reference to FIGS. 2-5.

Figure 2:
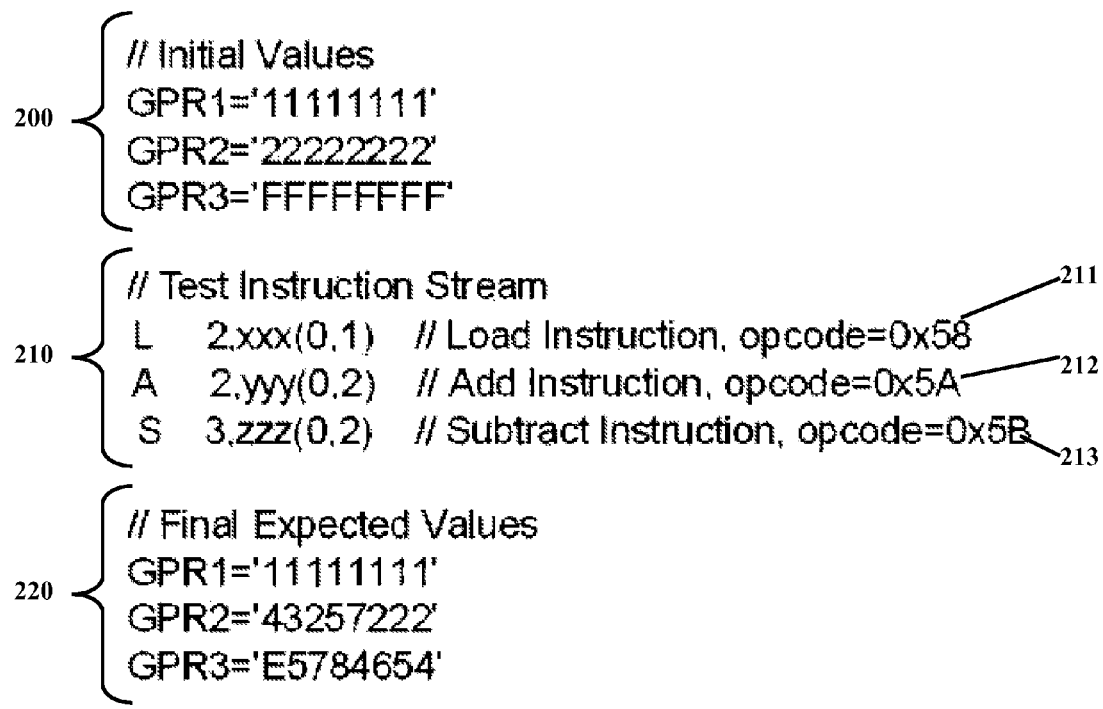
FIG. 2 is a sample instruction stream test case.

With reference to FIG. 2, a sample instruction stream test case for, e.g., an AVP includes an initial value listing 200, a test instruction stream listing 210 and a final expected values listing 220. Here, the initial values are defined within the initial value listing 200 as GPR1='11111111', GPR2—'22222222' and GPR3='FFFFFFFF'. The test instruction stream listing 210 includes a load or "L" instruction 211, an add or "A" instruction 212 and a subtract or "S" instruction 213. The final expected values listing 420 indicates that the expected final values are GPR1='11111111', GPR2—'432572222' and GPR3='E5784654'.

Figure 3:
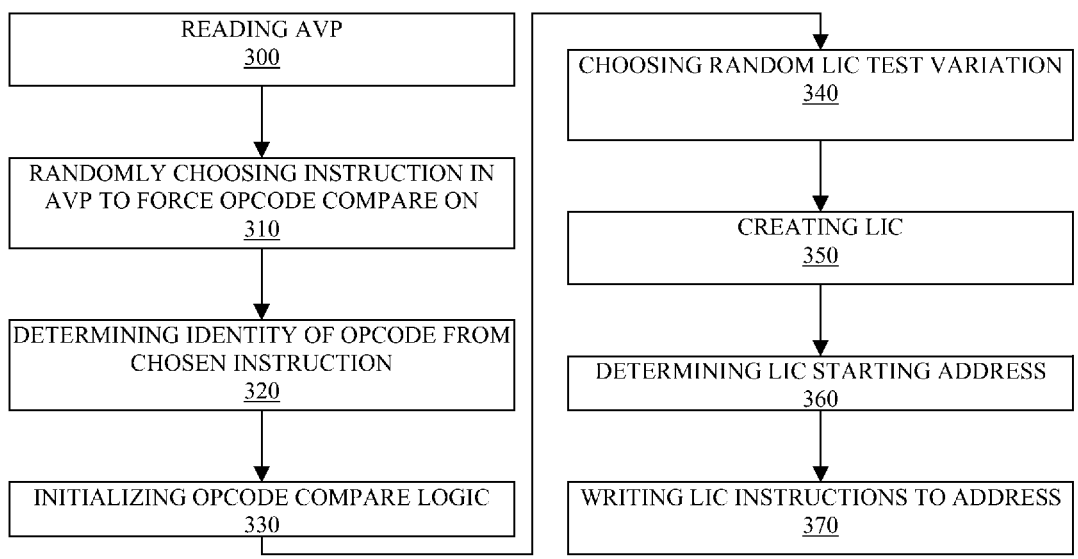
FIG. 3 is a flow diagram illustrating programming to initialize Opcode Compare and dynamically build licensed internal code for special testing.
Figure 5:
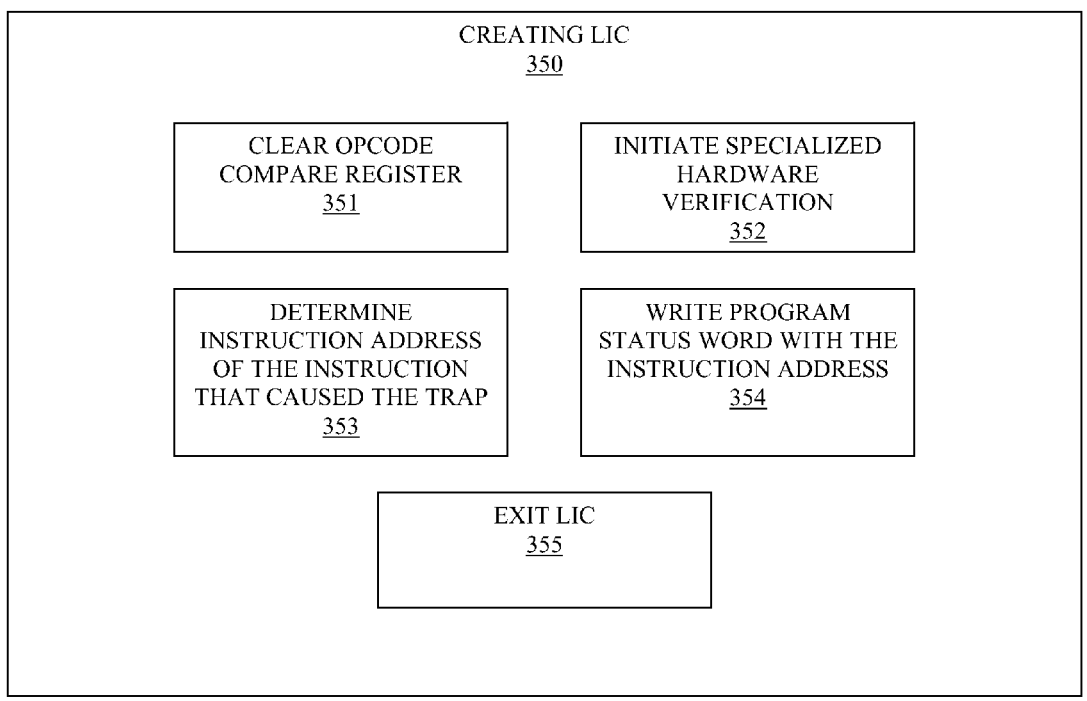
FIG. 5 is a schematic diagram illustrating an effect of creating the LIC.

With reference to FIGS. 3, 4 and 5, programming of an RTX to initialize Opcode Compare and dynamically build LIC for special testing is provided. As shown, the programming first includes reading the AVP (300) and randomly choosing an instruction in the AVP, such as one or more of the instructions provided in the test instruction stream listing 210, to force Opcode Compare on (310). This instruction must be a 'hardware executed' instruction in that it is not already implemented in LIC.

The RTX program then determines an identity of the opcode from the chosen instruction (320) and initializes the Opcode Compare logic by initializing an Opcode Compare register, which may be embodied in microprocessor 105 of FIG. 1, with the opcode (330). This forces or traps the chosen instruction to LIC. At this point, a random LIC test variation is chosen (340) and LIC is created (350). As shown in FIG. 4, the LIC may be created in order to perform exemplary LIC instructions to wait for a translator to not be busy, to turn on purge control, to wait for purge to be complete, to clear a compare register, to read old instruction addresses, to update new instruction addresses and/or to leave LIC mode. It is to be understood that these instructions are merely exemplary and that other instructions are possible.

Similarly, as shown in FIG. 5, the creating of the LIC clears the Opcode Compare register (351), which caused the trap. In this way, continually re-entering the LIC for the same instruction is prevented. The creating of the LIC also initiates performance of specialized hardware verification (352), by exercising a hardware function controllable by LIC, the exercising including dynamically building the LIC instructions and invoking the LIC instructions. That is, in one exemplary embodiment, the creating of the LIC initiates performance of specialized hardware verification (352) by, e.g., writing a bit in a control register to, for example, cause a 'Purge TLB'. The creating of the LIC may further include determining an instruction address of the instruction that caused the trap (353), writing the program status word with the instruction address (354) and, eventually, exiting LIC (355).

Referring back to FIG. 3, upon creation of the LIC (350), an LIC starting address in simulation model memory is determined (360) for the Opcode instruction that is chosen to thereby force the Opcode Compare on. The LIC instructions are then written to the LIC area at the LIC starting address (370).

The procedures discussed above with reference to FIGS. 3-5 thus cause a randomly chosen hardware executed instruction to be forced to LIC. After the LIC is done with the specialized verification, it effectively nullifies that instruction. That is, when the LIC exits, since the instruction address points at the same instruction that caused the trap, the chosen instruction will be executed a second time. Further, since the LIC had cleared the Opcode Compare register, the instruction will be executed directly by hardware during this second run time and will complete it as expected by the AVP. Thus, specialized logic that was to be tested has been exercised in a manner that was transparent to the original AVP.

Figure 6:
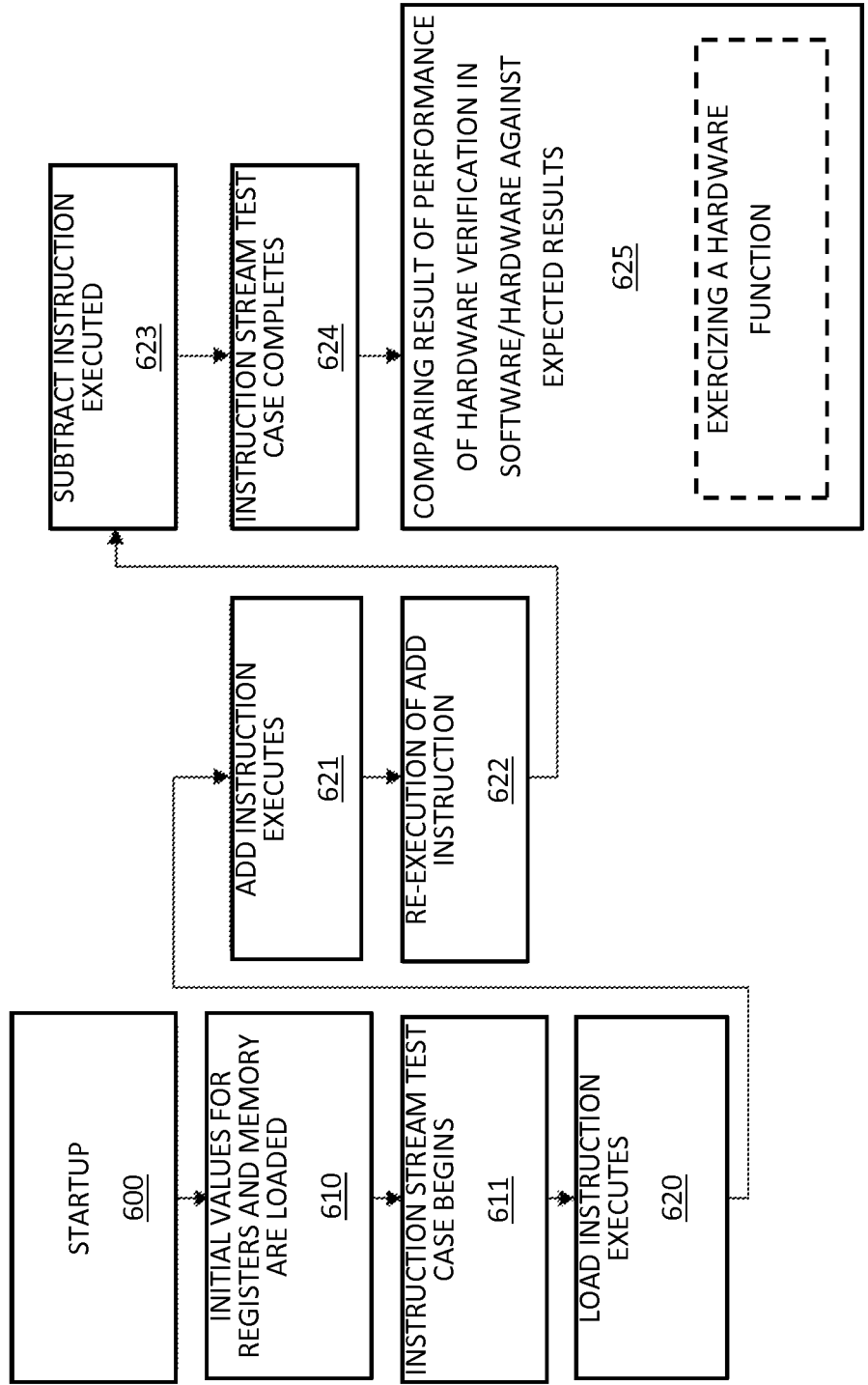
FIG. 6 is a flow diagram illustrating a simulation model execution flow.

With reference to FIG. 6, a simulation model execution flow is provided. As shown in FIG. 6, the RTX programming discussed above is executed at startup to build/load LIC and the opcode_compare_register (600). At this point, initial values for registers and memory are loaded into the simulation model (610) and the instruction stream test case begins (611). Here, the load instruction executes (620) and is followed by the execution of the add instruction (621) whereby each of the sample LIC instructions of FIG. 4 are added with effects thereof caused as a result. Thus, in one exemplary case, the opcode_compare is trapped to the LIC, the TLB is purged, the opcode_compare register is cleared, the PGM IA points to the add instruction and LIC exits. Once the execution of the add instruction (621) is completed, the add instruction is executed again (622) by hardware since there is no trap to LIC. Finally, the subtract instruction is executed (623), the instruction stream test case completes (624) and the final register and memory results are compared versus expected values (625).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all features in the claims below are intended to include any structure, material or act for performing the operation in combination with other claimed features as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more non-transitory computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, cause execution of the operations/acts specified in the flowchart and/or block diagram block or blocks.

These computer program instructions may also be stored in a non-transitory computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams illustrate architecture, functionality and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer program product for performing a verification operation, the computer program product comprising a non-transitory tangible storage medium readable by a processing circuit and storing instructions for execution by the processing circuit for performing a method comprising:
   randomly choosing a hardware executed instruction in a predefined program to force Opcode Compare on;
   determining an identity of a corresponding opcode from the chosen instruction and initializing Opcode Compare logic to trap the chosen instruction to firmware; and
   creating firmware to initiate performance of hardware verification in the firmware and re-initiating performance of the hardware verification in hardware.

2. The computer program product according to claim 1, wherein the predefined program comprises an architectural verification program (AVP).

3. The computer program product according to claim 2, wherein the method further comprises reading the AVP to identify the randomly chosen hardware executed instruction.

4. The computer program product according to claim 1, wherein the initializing of the Opcode Compare logic comprises initializing an Opcode Compare register.

5. The computer program product according to claim 4, wherein the creating of the firmware comprises:
choosing a random test variation;
clearing the Opcode Compare register, which caused the trap, to initiate the performance of the specialized hardware verification;
determining an instruction address of the instruction that caused the trap;
writing a program status word with the instruction address; and
exiting firmware.

6. The computer program product according to claim 1, wherein the initiating the performance of the hardware verification in firmware comprises:
determining a firmware starting address in a simulation model memory upon creation of the firmware for the Opcode instruction that is chosen; and
writing the firmware instructions at the firmware starting address.

7. The computer program product according to claim 1, further comprising comparing a result of the performance of the hardware verification in software against expected results.

8. The computer program product according to claim 1, further comprising comparing a result of the performance of the hardware verification in hardware against expected results.

9. The computer program product according to claim 1, wherein the performance of hardware verification in the firmware comprises exercising a hardware function controllable by firmware.

10. The computer program product according to claim 9, wherein the exercising comprises:
dynamically building firmware instructions; and
invoking the firmware instructions.

11. An apparatus for performing verification, the apparatus comprising:
a microprocessor in communication with a memory unit configured to perform a method comprising:
randomly choosing a hardware executed instruction in a predefined program to force Opcode Compare on;
determining an identity of a corresponding opcode from the chosen instruction and initializing Opcode Compare logic to trap the chosen instruction to firmware; and
creating firmware to initiate performance of hardware verification in the firmware and re-initiating performance of the hardware verification in hardware.

12. The apparatus according to claim 11, wherein the predefined program comprises an architectural verification program (AVP).

13. The apparatus according to claim 12, wherein the method further comprises reading the AVP to identify the randomly chosen hardware executed instruction.

14. The apparatus according to claim 11, wherein the initializing of the Opcode Compare logic comprises initializing an Opcode Compare register.

15. The apparatus according to claim 14, wherein the creating of the firmware comprises:
choosing a random test variation;
clearing the Opcode Compare register, which caused the trap, to initiate the performance of the specialized hardware verification;
determining an instruction address of the instruction that caused the trap;
writing a program status word with the instruction address; and
exiting firmware.

16. The apparatus according to claim 11, wherein the initiating the performance of the hardware verification in firmware comprises:
determining a firmware starting address in a simulation model memory upon creation of the firmware for the Opcode instruction that is chosen; and
writing the firmware instructions at the firmware starting address.

17. The apparatus according to claim 11, further comprising comparing a result of the performance of the hardware verification in software against expected results.

18. The apparatus according to claim 11, further comprising comparing a result of the performance of the hardware verification in hardware against expected results.

19. The apparatus according to claim 11, wherein the performance of hardware verification in the firmware comprises exercising a hardware function controllable by firmware, the exercising comprising:
dynamically building firmware instructions; and
invoking the firmware instructions.

20. A computer implemented method of verification, the method comprising:
building/loading firmware and an opcode compare register;
loading initial values for registers and memory into a simulation model and beginning an instruction stream test case to trap an opcode compare to the firmware, to execute a translation lookaside buffer (TLB) purge, to clear to opcode compare register, to point to an add instruction and to exit firmware;
re-executing the add instruction by hardware; and
executing a subtract instruction to complete the instruction stream test case and comparing final register and memory results against expected values.

* * * * *